United States Patent [19]
Padgett

[11] 4,085,366
[45] Apr. 18, 1978

[54] NOISE REDUCTION DEVICE FOR CITIZEN'S BAND TRANSCEIVERS

[76] Inventor: Billy Padgett, 606 S. Ohio St., Sedalia, Mo. 65301

[21] Appl. No.: 727,955

[22] Filed: Sep. 29, 1976

[51] Int. Cl.² .............................................. H04B 1/40
[52] U.S. Cl. ...................................... 325/22; 325/65; 325/319; 325/387
[58] Field of Search ................................... 325/21–23, 325/15, 65, 319, 371, 377, 387, 397, 400, 472, 473; 343/701, 175

[56] References Cited
U.S. PATENT DOCUMENTS

| 3,449,674 | 6/1969 | Pace | 325/21 |
| 3,582,680 | 6/1971 | Slavin | 325/473 |
| 3,584,301 | 6/1971 | Tomaszewski | 343/175 |
| 3,774,218 | 11/1973 | Fowler | 343/701 |
| 3,968,438 | 7/1976 | Thanos | 325/319 |

*Primary Examiner*—Benedict V. Safourek
*Assistant Examiner*—Michael A. Masinick
*Attorney, Agent, or Firm*—Fishburn, Gold & Litman

[57] ABSTRACT

A noise reduction device for use with citizen's band transceivers to reduce interference caused by signals from distant sources during reception without impairing the transmitter section's performance includes a transistor in a self-biasing arrangement, a switch for bypassing the transistor, a housing, and conventional coaxial connections for connecting the device between the transceiver and the antenna.

8 Claims, 2 Drawing Figures

NOISE REDUCTION DEVICE FOR CITIZEN'S BAND TRANSCEIVERS

The present invention relates to noise reduction devices in radio communications and more particularly to such a device for reducing interference caused by distant signals in citizen's band communications.

The present day use of citizen's band (CB) radios has proliferated to such an extent that in highly populated areas the channels are overcrowded, making communications difficult. Compounding the problem are atmospheric conditions which propagate the low power CB signals substantial distances due to reflections thereof from the ionosphere, such reflective signal propagation being known as "skip". While intentional use of skip for long distance communication on CB channels is prohibited by FCC regulations, such signals are nevertheless a reality and may interfere with local communications. Such interference is more likely to occur in stations employing sensitive receivers in combination with efficient antenna systems.

While it would be possible to decrease the sensitivity of a CB receiver by decreasing the gain of the radio frequency (rf) amplififer section thereof, such a control is not generally included on the transceivers that are commercially available. Therefore, an add-on device for decreasing the transceiver's sensitivity during reception without impairing the transmission performance is desirable.

The principal objects of the present invention are: to provide a device for reducing the strength of a received signal to a transceiver during reception without appreciably affecting the performance of the transmitter section; to provide such a device which does not substantially increase the standing wave ratio of the antenna system during transmission; to provide such a device which may be used for reducing interference due to random noise during reception; to provide such a device which automatically changes between reception and transmission modes without the need for manually operating a switch; to provide such a device which includes a switch for selectively bypassing the device in the absence of interference; to provide such a device which has as its principal component a transistor in a self-biased circuit arrangement; to provide such a device which may be constructed using a variety of transistors; to provide such a device which may be conveniently installed on or removed from existing equipment, requiring no special technical skills or tools; to provide such a device which is operable with virtually any citizen's band transceiver available; to provide such a device which is economical to manufacture, positive in operation, durable in use, and which is particularly well adapted for its intended purpose.

Other objects and advantages of this invention will become apparent from the following description taken in connection with the accompanying drawings wherein are set forth, by way of illustration and example, certain embodiments of this invention.

The drawings constitute a part of the specification, include an exemplary embodiment of the present invention, and illustrate various objects and features of the noise reduction device.

Figure 1:
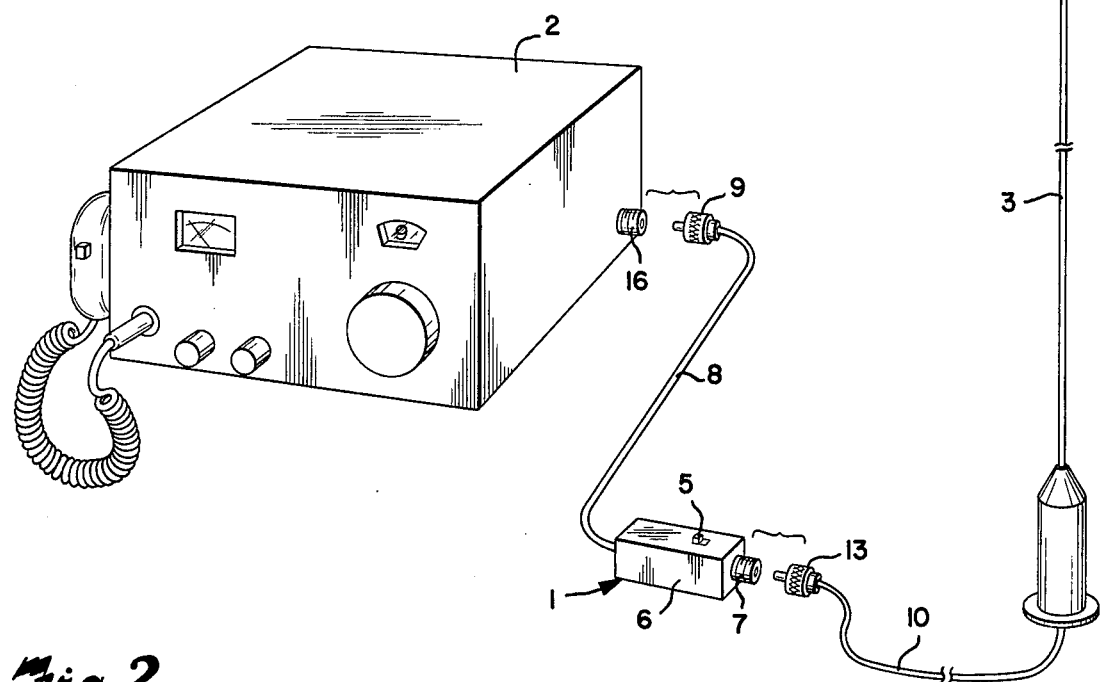
FIG. 1 is a perspective drawing of the noise reduction device enclosed in a protective housing and connected between a transceiver and an antenna.

As required, detailed embodiments of the present invention are disclosed herein. However, it is to be understood that the disclosed embodiments are merely exemplary of the invention which may be embodied in various forms. Therefore, specific structural and functional details disclosed herein are not to be interpreted as limiting but merely as a basis for the claims and as a representative basis for teaching one skilled in the art to variously employ the present invention in virtually any appropriately detailed structure.

Referring to the drawings in more detail:

The reference numeral 1 generally designates a noise reduction device for connection between a citizen's band (CB) transceiver 2 and the antenna 3 thereof for reducing interference caused by signals from distant sources during the reception mode of the transceiver 2.

The noise reduction device 1 includes a PNP type transistor 4 and a bypass switch 5. A housing 6 is provided for enclosing the transistor 4 and connections thereto and for mounting the switch 5 and an antenna cable receptacle 7. A coaxial cable 8 extends from the housing 6 and terminates in an antenna plug 9.

The transceiver 2 and the antenna 3 are conventional, commercially available components of an existing CB station, mobile or fixed. The antenna 3 includes a coaxial antenna cable 10, having a lead 11 and a shield 12, and terminates in an antenna cable plug 13, having a lead portion 14 connected to the cable lead 11 and a shield portion 15 connected to the cable shield 12. The transceiver 2 includes a coaxial antenna plug receptacle 16 for normally receiving the antenna plug 13. The receptacle 16 includes a lead portion 17 and a shield portion 18. The antenna plug 13 and the receptacle 16 preferably are a type PL-259 and SO-239 respectively, which are commonly used in such applications.

The device receptacle 7 includes a lead portion 19 and a shield portion 20. The plug 9 includes a lead portion 21 and a shield portion 22 connected respectively to a lead 23 and a shield 24 of the device cable 8. The plug 9 receptacle 7 also are preferably a PL-259 and an SO-239 respectively to be compatible with the receptacle 16 of the transceiver 2 and the plug 13 of the antenna 3.

The transistor 4 of the noise reduction device 1 is a PNP type transistor, such as a Motorola HEP S0019 or an equivalent. It is conceivable that other solid state devices having operating characteristics applicable to the present invention could be used. Therefore, it is to be understood that the present invention is not to be limited to the use of a PNP transistor.

In order to reject distant, and consequently weaker, signals while admitting stronger local signals during reception, resistance is introduced into the antenna system. It is desirable to remove such resistance during transmission in order to utilize the full power of the transmitter section and also to prevent an increased standing wave ratio in the antenna system which could be destructive to the components of the transmitter section. It is also desirable that such resistance be added and removed automatically without the need for manually throwing switches.

Figure 2:
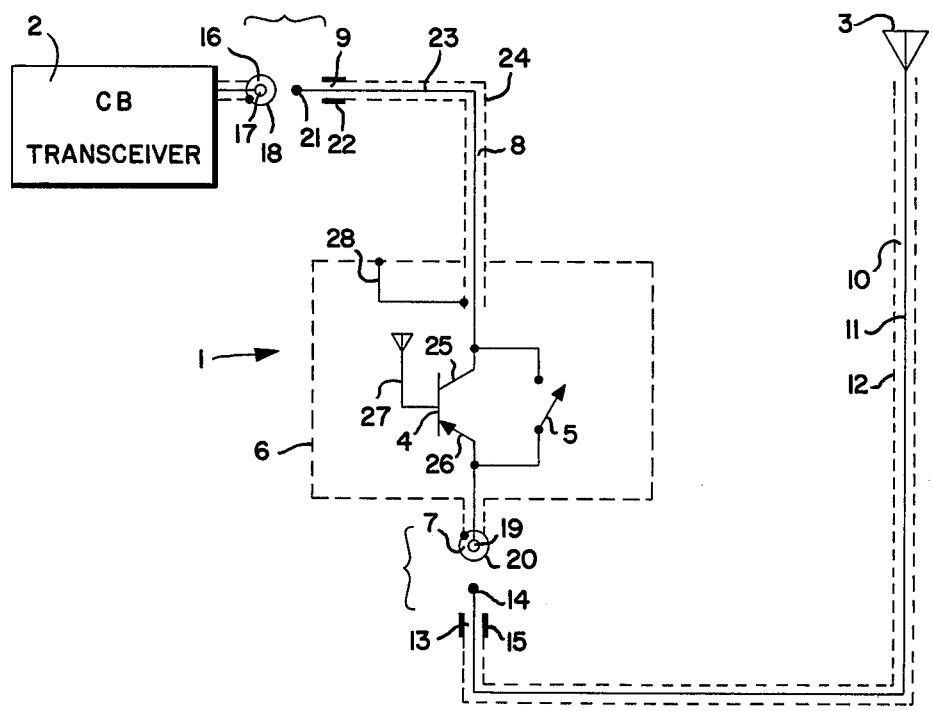
FIG. 2 is a schematic diagram of the noise reduction device connected between a transceiver and an antenna.

Therefore, the transistor 4 is interposed between the transceiver 2 and the antenna 3. As illustrated in FIG. 2, the collector 25 of the transistor 4 is connected to the lead 23 of the device cable 8 while the emitter 26 is connected to the lead portion 19 of the device receptacle 7. In the absence of a bias at the transistor base 27, a high resistive impedance exists between the emitter 26 and the collector 25. This is the desired condition for rejecting the distant signals during the reception mode of the transceiver 2.

In order to remove the collector to emitter impedance for transmitting it is necessary to supply a bias signal to the transistor base 27. In the present invention this is accomplished by using the transistor base lead 27 as an antenna to receive radio frequency (rf) energy from the antenna cable system. The rf energy received biases the base 27, therefore the collector to emitter impedance is reduced substantially thereby allowing passage of the transmitted signal to the antenna 3. It has been determined that a base lead length on the order of three-sixteenths of an inch (3/16 inch) is optimum for biasing the transistor 4.

In order to bypass the transistor 4 in the absence of interference, the switch 5 is connected between the collector 25 and the emitter 26. In the closed position, the switch 5 allows the transmitted signal, as well as received signals, to flow freely between the transceiver 2 and the antenna 3.

The performance of the noise reduction device 1 is enhanced by enclosing the transistor 4 in a metal housing 6. The housing 6 also provides a mounting means for the transistor 4, the bypass switch 5, the device cable 8, and the device receptacle 7. The receptacle 7 may be mounted such that the shield portion 20 thereof is electrically connected to the housing 6. To provide a complete path for signals, the shield 24 of the cable 8 is connected to the housing 6 as by the conductor 28.

In operation (see FIG. 1) the antenna plug 13, normally connected to the transceiver receptacle 16, is removed. The device plug 9 is connected in its place to the receptacle 16, and the plug 13 is connected to the device receptacle 7. In the absence of interference, the switch 5 is closed and the transceiver may be operated in a normal manner.

In the presence of interference, random electrical or distant reflected signals, the switch 5 is opened and, again, the transceiver is operated in a normal manner. During reception, the collector to emitter impedance reduces the incoming signals, both local and distant. However, since the distant signal is weaker, it is effectively rejected. During transmission, leakage of rf energy within the housing 6 is received by the base lead 27, thereby biasing the transistor 4 and substantially removing the collector to emitter impedance, thereby allowing the transmitted signal to pass unimpeded to the antenna 3.

It is to be understood that while certain forms of the present invention have been described and illustrated, it is not to be limited to those forms except insofar as such limitations are included in the following claims.

What is claimed and desired to secure by Letters Patent is:

1. A noise reduction device in combination with a transceiver and an antenna therefor, said transceiver having a transmission mode and a reception mode and including a lead conductor and a shield conductor, said antenna including an antenna cable having a lead and shield thereof normally connected to said transceiver lead conductor and shield conductor respectively, said noise reduction device comprising:
 (a) a solid state means having a first, a second, and a third terminal, each terminal including a lead connected thereto, said first and second terminals normally having a high impedance therebetween and having a low impedance therebetween in response to a suitable bias signal applied to said third terminal;
 (b) said solid state means being interposed between said transceiver and said antenna for reducing the signal strength to said transceiver during the reception mode by means of said normal high impedance between said first and second terminals, said first terminal being connected to said antenna cable lead and said second terminal being connected to said transceiver lead conductor, and said antenna cable shield being connected to said transceiver shield conductor; and
 (c) a bias antenna connected to said third terminal and operative upon reception of radio frequency energy emitted by said transceiver during said transmission mode to apply said energy as a suitable bias signal to said third terminal thereby effecting said low impedance between said first and second terminals.

2. A noise reduction device as set forth in claim 1 wherein:
 (a) said solid state means is a transistor having an emitter, a collector, and a base; and
 (b) said first terminal is connected to the emitter of said transistor, said second terminal is connected to the collector of said transistor, and said third terminal is connected to the base of said transistor.

3. A noise reduction device as set forth in claim 1 wherein said bias antenna is said third terminal lead cut to a selected length.

4. A noise reduction device as set forth in claim 1 including a switch connected between said first and second terminals and selectively closable to bypass said solid state means.

5. A noise reduction device as set forth in claim 4 wherein said transceiver includes an antenna receptacle, including a lead conductor and a shield terminal connected to said transceiver shield conductor, and wherein said antenna cable terminates in an antenna cable plug having a lead portion and a shield portion connected respectively to said antenna cable lead and shield, said antenna cable plug being normally receivable in said transceiver antenna receptacle, said device including:
 (a) a device receptacle having a lead portion connected to said solid state means first terminal and a shield portion, said antenna cable plug being received in said device receptacle;
 (b) a device cable having a lead and a shield, said device cable lead being connected to said solid state means second terminal, said device cable shield being connected to said device receptacle shield portion; and
 (c) said device cable terminating in a device cable plug having a lead portion and a shield portion connected respectively to said device cable lead and shield, said device cable plug being received in said transceiver antenna receptacle.

6. A noise reduction device as set forth in claim 5 including a housing enclosing said solid state means, mounting said switch and said device receptacle, and having said device cable extending therefrom.

7. A noise reduction device adapted for operable connection with a transceiver and an antenna therefor, and wherein said transceiver has a transmission mode and a reception mode and includes a lead conductor and a shield conductor, and wherein said antenna includes an antenna cable having a lead and a shield thereof normally for connection to said transceiver lead conductor and shield conductor respectively, said noise reduction device comprising:

(a) a housing;

(b) a transistor mounted in said housing, said transistor including an emitter, a collector, and a base and respective leads thereof, said emitter and collector normally having a substantially high impedance therebetween and having a low impedance therebetween in response to the application of a suitable bias signal to said base, said normal high impedance being adapted for reducing signal strength to said transceiver during the reception mode thereof;

(c) emitter connector means mounted on said housing, connected to said emitter, and adapted for connection of said emitter to said antenna cable lead;

(d) collector connector means supported by said housing, connected to said collector, and adapted for connection of said collector to said transceiver lead conductor;

(e) shield connector means in association with said emitter connector means and said collector connector means for connection of said antenna cable shield to said transceiver shield conductor; and (f) a bias antenna connected to said transistor base and operative upon reception of radio frequency energy emitted by said transceiver during the transmission mode thereof to apply said energy as a suitable bias signal to said base thereby effecting said low impedance between said emitter and said collector.

8. A noise reduction device as set forth in claim 7 wherein said transceiver includes an antenna receptacle having a lead terminal and a shield terminal connected respectively to said transceiver lead and shield conductors and wherein said antenna cable terminates in an antenna cable plug having a lead portion and a shield portion connected respectively to said antenna cable lead and shield, said antenna cable plug being normally receivable in said transceiver antenna receptacle, said noise reduction device including:

(a) a device receptacle mounted on said housing and having a lead portion and a shield portion, said lead portion being connected to said emitter and comprising said emitter connector means, said device receptacle being adapted for removable reception of said antenna cable plug;

(b) a device cable extending from said housing and having a lead and a shield, said device cable lead being connected to said collector, said device cable shield and said device receptacle shield portion being interconnected and comprising said shield connector means; and (c) said device cable terminating in a device cable plug having a lead portion and a shield portion connected respectively to said device cable lead and shield, said device cable plug lead and said device cable lead comprising said collector connector means, said device cable plug being adapted for removable insertion into said transceiver antenna receptacle.

* * * * *